United States Patent
Chen et al.

(10) Patent No.: US 7,612,568 B2
(45) Date of Patent: Nov. 3, 2009

(54) OPEN-CIRCUIT TESTING SYSTEM AND METHOD

(75) Inventors: Chien-Wei Chen, Taipei County (TW); Chia-Ming Chen, Taipei County (TW)

(73) Assignee: Test Research, Inc., Taipei (TW)

( * ) Notice: Subject to any disclaimer, the term of this patent is extended or adjusted under 35 U.S.C. 154(b) by 131 days.

(21) Appl. No.: 11/743,641

(22) Filed: May 2, 2007

(65) Prior Publication Data
US 2008/0218175 A1 Sep. 11, 2008

(30) Foreign Application Priority Data
Mar. 8, 2007 (TW) .............................. 96108085 A

(51) Int. Cl.
G01R 31/00 (2006.01)
G01R 31/02 (2006.01)

(52) U.S. Cl. ..................... 324/538; 324/500; 324/537

(58) Field of Classification Search ................ 324/538; 439/54, 169, 219, 482
See application file for complete search history.

(56) References Cited

U.S. PATENT DOCUMENTS

| | | | | |
|---|---|---|---|---|
| 5,254,953 A * | 10/1993 | Crook et al. | ............... | 324/538 |
| 5,391,993 A * | 2/1995 | Khazam et al. | ............. | 324/684 |
| 5,452,953 A | 9/1995 | Ledger | | |
| 5,486,753 A * | 1/1996 | Khazam et al. | ............ | 324/72.5 |
| 5,557,029 A | 9/1996 | Lin et al. | | |
| 5,696,451 A * | 12/1997 | Keirn et al. | .................. | 324/687 |
| 6,104,198 A * | 8/2000 | Brooks | ....................... | 324/538 |
| 6,717,415 B2 * | 4/2004 | Sunter | ........................ | 324/519 |
| 7,219,023 B2 * | 5/2007 | Banke et al. | ................... | 702/58 |

FOREIGN PATENT DOCUMENTS

TW 540709 7/2003

* cited by examiner

*Primary Examiner*—Timothy J Dole
*Assistant Examiner*—Farhana Hoque
(74) *Attorney, Agent, or Firm*—Baker & McKenzie LLP

(57) ABSTRACT

The invention discloses a testing system and method suitable for determining the connection state of an electronic component in an electronic device assembly. In an embodiment, the testing system comprises a signal sensing unit configured to provide a sensed signal induced by capacitive coupling in response to the output of a testing signal passing through a tested pin, a signal processor unit configured to filter and over-sample the sensed signal to obtain a digital signal, and an analyzer unit configured to compute the digital signal for determining a connection state of the test pin.

13 Claims, 3 Drawing Sheets

OPEN-CIRCUIT TESTING SYSTEM AND METHOD

CROSS-REFERENCE TO RELATED APPLICATIONS

This application claims priority of Taiwan application No. 096108085, filed on Mar. 8, 2007.

FIELD OF THE INVENTION

The invention relates to a testing system and method for determining the connection state of an electronic component in an electronic device assembly. More particularly, the invention discloses a testing system and method that use capacitive coupling for determining the connection state of a tested pin of an electronic component in an electronic device assembly.

DESCRIPTION OF THE RELATED ART

In the manufacture of a printed circuit board assembly, an essential testing stage consists of determining whether every integrated circuit (IC) or connector is properly connected to the print circuit board. This testing, also commonly called "open-circuit" testing, detects manufacture defects so that the occurrence of test failures in a subsequent functional testing can be reduced. Conventionally, an in-circuit tester uses a manufacture defect analyzer to automatically and quickly detect manufacture defects caused by damages, short-circuits, open solder joints, mislocation or similar defects. However, the manufacture defect analyzer is usually advantageous only for testing an analog signal component. For testing a digital circuit such as an application specific integrated circuit designed customer demands, a more complicated testing process is needed to provide reliable testing results.

For determining a connection state between an integrated circuit or connector and a printed circuit board, a well-known technique using capacitive coupling constitutes a relatively convenient, reliable, vector-less, and nondestructive testing method. This method consists in inducing a capacitor coupling between a lead frame of the integrated circuit and a sensor plate, which produces a small coupling signal that can be used to determine the connection state of the electronic device assembly. Typically, an alternating source signal is delivered through a tested pin of the integrated circuit to induce the capacitive coupling. If the tested pin is properly connected, a sensed signal induced by the capacitive coupling will correspond to a sensed electric signal A (voltage or current), for example. In contrast, if a failure occurs in the connection state between the integrated circuit or the connector and the print circuit board, a sensed signal induced by a weaker capacitive coupling will correspond to an electric signal B different from electric signal A. Thus, with the use of a varying amount of small alternating source signal, the connection state of the integrated circuit can be determined. This technique is broadly used in current manufacture lines, and is described in U.S. Pat. No. 5,254,953, the disclosure of which is incorporated herein by reference.

As the semiconductor manufacturing process advances, packaged integrated circuits are fabricated with an increasingly higher density and smaller volume. The dimensions of the lead frame in the packaged integrated circuit thus are significantly reduced. This miniaturization trend has led to the design of well-known "ball grid array" packages or like advanced packaging schemes. Similarly, new types of connectors such as PCI-E, DDR2/3, and CPU sockets have been developed with shortened leads. Due to the shrinkage and modification in the geometry of the leads, an application of the above testing method will induce very weak capacitance coupling between the lead frame and the sensor plate, which reduces the signal-to-noise ratio of the sensed signal. Consequently, the risk of erroneous determination of the connection state is increased, and the testability of the connection state between the integrated circuit and the printed circuit board drops.

A threshold value for a conventional capacitive-coupling testing method is about 20 fF (where 1 fF=$10^{-15}$ Farad), below which this method is unable to provide a correct determination. Unfortunately, about 30% to 40% of the tested pins of a standard ball grid array package induce a capacitive coupling below the threshold value, which results in a reduced coverage of the testing method using capacitive coupling. Thus, the conventional testing method is not adapted for ball grid array package manufacturing lines, especially for testing packaged integrated circuits with high-density pins that induce very weak capacitive coupling.

Some variant approaches of the capacitive-coupling testing method are also described in Taiwan Patent No. 540709 and U.S. Pat. Nos. 5,486,753; 5,452,953 and 5,557,029, the disclosures of which are incorporated herein by reference. However, the disclosed approaches equally fail to effectively address the issue of weakened capacitive coupling due to a higher density of the tested pins.

Therefore, there is a need for an improved testing system and method that can increase the testing coverage and overcome the foregoing problems of the prior art.

SUMMARY OF THE INVENTION

The application describes a testing system and method for determining the connection state of a tested pin of an electronic component mounted in an electronic device assembly. The electronic component may be an integrated circuit, a connector or similar components provided in an electronic device assembly such as a printed circuit board assembly.

In an embodiment, the testing system comprises a signal sensing unit configured to provide a sensed signal induced by capacitive coupling in response to the output of a testing signal passing through a tested pin, a signal processor unit configured to filter and over-sample the sensed signal to obtain a digital signal, and an analyzer unit configured to compute the digital signal for determining a connection state of the test pin. In some embodiments, the signal processor unit may include an anti-alias filter through which the sensed signal is processed before being over-sampled, and a digital filter adaptable to filter the digital signal. The digital filter can be a finite impulse response filter.

According to some aspects of the invention, a validation test may be applied to determine whether the sensed signal correctly reflects the connection state of the tested pin. The validation test may comprise computing the digital signal to determine a correspondence with a predetermined capacitive coupling reference. If the validation test determines no correspondence with the predetermined capacitive coupling reference, the sensed signal does not correctly reflect the connection state of the tested pin, and the frequency and/or amplitude of the testing signal is raised. If the validation test determines a correspondence with the predetermined capacitive coupling reference, the digital signal is converted into frequency-domain spectrum data based on which the connection state of the tested pin is evaluated.

The testing system and method according to the present invention specifically processes the sensed signal so that errors in the determination of the connection state due to insufficient capacitive coupling can be advantageously reduced.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENTS

The application describes a testing system and method for determining the connection state of a tested pin of an electronic component mounted in an electronic device assembly. The electronic component may include, but is not limited to, an integrated circuit, a connector or similar components provided in an electronic device assembly such as a printed circuit board assembly.

Figure 1:
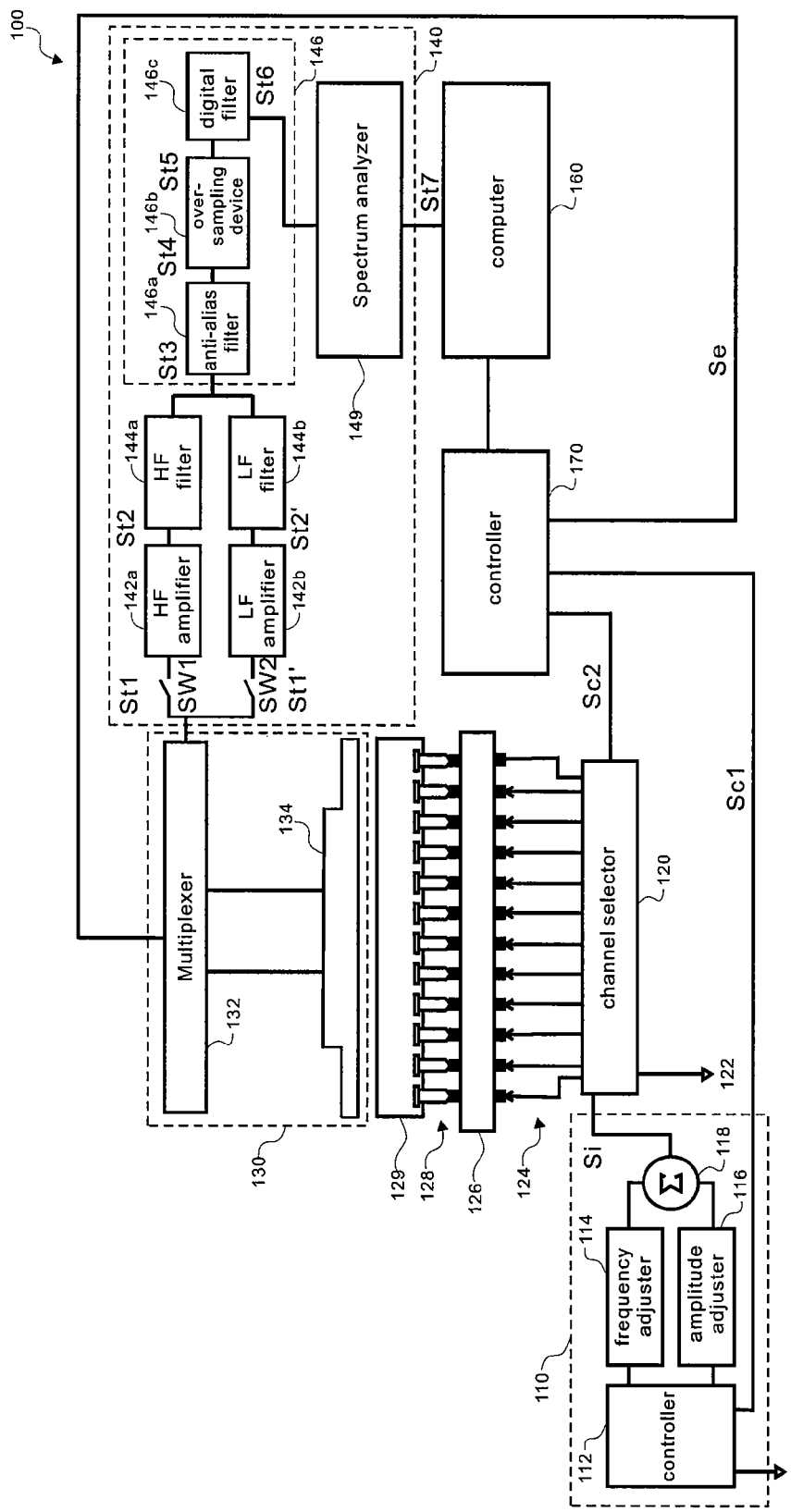
FIG. 1 is a schematic diagram of a testing system according to one embodiment of the invention.

FIG. 1 is a block diagram of a testing system according to an embodiment of the invention. Reference number 100 designates a testing system suitable for determining the connection state of an electronic device assembly, for example, comprised of a printed circuit board 126 and an integrated circuit 129. The testing system 100 includes a testing signal source 110, channel selector 120, signal sensing unit 130, signal processor unit 140, computer 160 and controller 170.

The testing signal source 110 comprises a signal source controller 112, programmable frequency adjuster 114, programmable amplitude adjuster 116 and collector 118. The signal source controller 112 is configured to adjust the frequency and amplitude of the testing signal Si through control of the programmable frequency adjuster 114, programmable amplitude adjuster 116 and collector 118. The channel selector 120 can be, for example, a drivable matrix switch. The channel selector 120 receives the testing signal Si and has outputs 124 connected with testing points of the printed circuit board 126 corresponding to pins 128 of the integrated circuit 129. The channel selector 120 is used to select one or more pins 128 to test, and ground the other pins to a ground 122.

The signal sensing unit 130 comprises a multiplexer 132 and sensor plate 134. The sensor plate 134 is placed on the integrated circuit 129 and connects with the input of the multiplexer 132. As the testing signal Si is inputted through the channel selector 120 to a tested point, a capacitive coupling is generated between the tested pin 128 of the integrated circuit 129 and the sensor plate 134. As a result, sensed analog signals St1 and St1' are produced and outputted from the multiplexer 132 to the signal processor unit 140. The controller 170 issues a select signal Sc2 to the channel selector 120 for selecting a tested pin of the integrated circuit 129. The controller 170 also outputs an enable signal Se to the multiplexer 132 corresponding to the select signal Sc2 so as to set an output of the sensed signal to the signal processor unit 140 corresponding to the tested pin.

Referring again to FIG. 1, the signal processor unit 140 is configured to process the sensed signal into a filtered digital signal St6 and generate frequency spectrum data St7 based on which the connection state of the tested pin will be evaluated. In the embodiment illustrated in FIG. 1, the signal processor unit 140 includes high (HF) and low (LF) frequency signal amplifier 142a and 142b, high and low frequency signal filter 144a and 144b, over-sampling analog-to-digital converter (ADC) 146, and spectrum analyzer 149. The state of switches SW1 and SW2 is set according to the frequency level of the sensed signal. According to its frequency level, a sensed signal thus is processed either through the high-frequency signal amplifier 142a and high-frequency signal filter 144a, or through the low-frequency signal amplifier 142b and low-frequency signal filter 144b. For example, if the sensed signal St1 is higher than about 100 kHz in frequency, it will be converted into an amplified signal St2 through the high-frequency signal amplifier 142a and then will process through the high-frequency signal filter 144a for removing signal noises. In contrast, if the sensed signal St1' is lower than 100 kHz in frequency, it will be converted into an amplified signal St2' through the low-frequency signal amplifier 142b and then will process through the low-frequency signal filter 144b for removing signal noises.

The over-sampling ADC 146 receives the signal St3 outputted from the high-frequency signal filter 144a or low-frequency signal filter 144b. The over-sampling ADC 146 includes an anti-alias filter 146a, over-sampling device 146b and tunable digital filter 146c. The anti-alias filter 146a is configured to filter the signal St3 and generate a corresponding filtered signal St4. Filtered signal St4 then is over-sampled through the over-sampling device 146b to provide digitalized signal St5. The tunable digital filter 146c is configured to remove signal noises from digital signal St5 and generate a filtered digital signal St6. In one embodiment, the tunable filter 146c may be a 256-tap finite impulse response filter, and the over-sampling ratio may be up to 25 times for frequency levels of the testing signal equal to about 100 kHz.

The spectrum analyzer 149 and the computer 160 work together as an analyzer unit to compute the digital signal St6 for evaluating the connection state of the tested pin. Before the connection state of the tested pin is determined, the testing system applies a validation test to determine whether the sensed signal St1' or St1, from which the digital signal St6 derives, correctly reflects the connection state of the tested pin. For this purpose, the digital signal St6 is used to derive an equivalent signal coupling value. The computed signal coupling value then is compared against one corresponding reference value or range of reference values stored in computer 160. The reference values stored in computer 160 are reference signal coupling measures obtained for standard test conditions, which may be capacitive coupling reference measures, for example. If the result of the comparison finds a correspondence of the computed signal coupling value with the associated reference value or that the computed signal coupling value falls within its predefined range, the sensed signal is accepted and digital signal St6 can be subsequently processed through the spectrum analyzer 149 and computer 160 for determining the connection state of the tested pin.

If the result of the comparison operation applied for the signal St6 does not correspond to the reference value, the sensed signal is likely an error signal that does not correctly reflect the connection state of the tested pin. The generation of an error signal may be due to shrunk dimensions of the integrated circuit, which causes improper capacitive coupling that reduces the signal-to-noise ratio. The sensed signal thus cannot be used for determining the connection state of the tested pin. To obtain a proper capacitive coupling, a relationship can be established between the capacitive coupling and a capacitor impedance expressed with the following expression:

$$Xc=1/j\omega C,$$

where j designates the imaginary unit, $\omega=2\pi f$ is the angular frequency, and C is the capacitance value.

The capacitive coupling will increase as the capacitor impedance decreases. Assuming that the capacitance C is fixed, a reduction of the capacitor impedance can be obtained by increasing the frequency "f" of the source signal. According to the present invention, the computer 160 thus outputs a control signal Sc1 to the signal source 110 to raise the frequency "f" of the testing signal Si, so that the sensed signal becomes a high-frequency sensed signal St1. Additionally, the state of switches SW1 and SW2 are changed so that the high-frequency sensed signal St1 will process through high-frequency signal amplifier 142a and high-frequency signal filter 144a. The frequency "f" can be raised above about 100 kHz, and more specifically between about 100 kHz and 500 kHz. In addition, the programmable amplitude adjuster 116 can be used to adjust the amplitude of the testing signal Si, which also contributes to increase the capacitive coupling. As a result, the signal-to-noise ratio is increased to obtain a sensed signal that correctly reflects the connection state of the tested pin and passes the validation test.

Figure 3A:
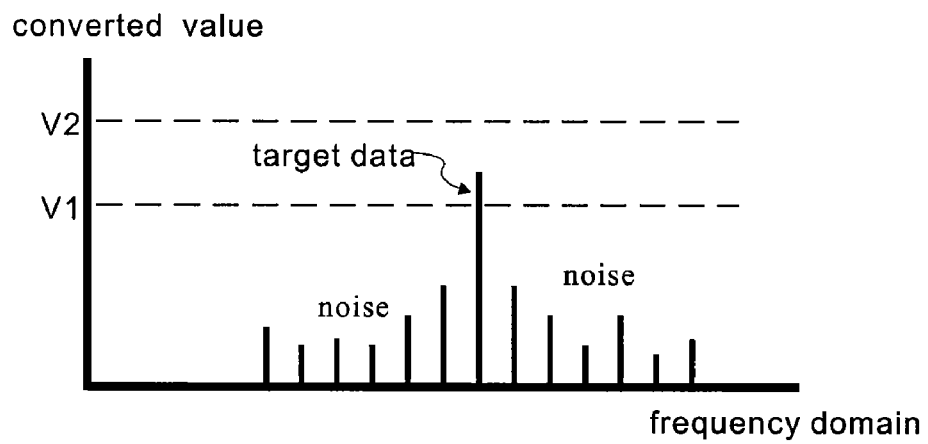
FIGS. 3a and 3b are schematic diagrams illustrating the determination of the connection state of a tested pin.
Figure 3B:
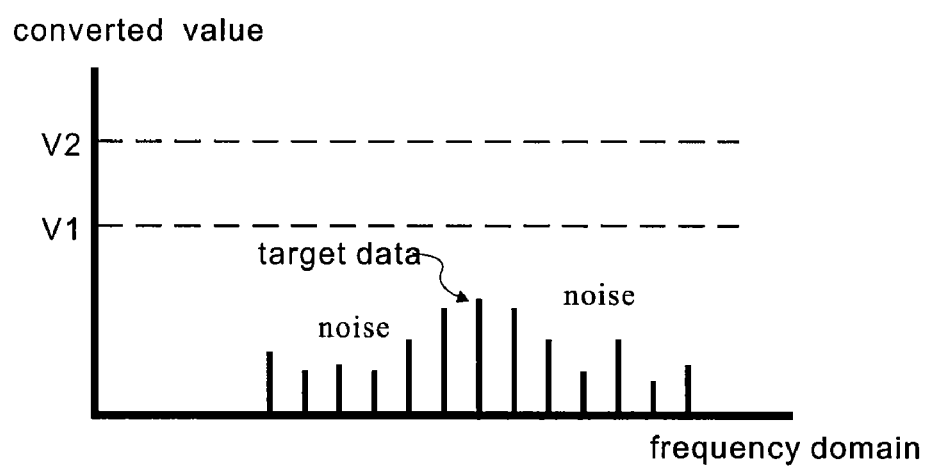

Once the validation test is passed, the spectrum analyzer 149 converts the digital signal St6 into frequency-domain spectrum data St7 comprised of multiple converted values. A suitable conversion method may be the Fast Fourier transform algorithm. However, other conversion algorithms may also be possible. The converted values in the frequency domain then are analyzed by computer 160 to determine the connection state of the tested pin. Referring to FIGS. 3a and 3b in conjunction with FIG. 1, the analysis operation performed by the computer 160 for determining the connection state of the tested pin of the integrated circuit is described. Based on the frequency-domain spectrum data, the computer 160 separates target data of converted values in the frequency domain from signal noise data. The obtained target data then are normalized and compared against a predetermined reference range [v1, v2]. As shown in FIG. 3a, if the computed target data is within the reference range [v1, v2], then the tested pin is properly connected to the printed circuit board. In contrast, if the target data is below the range [v1, v2], the tested pin has a connection failure, as shown in FIG. 3b.

As the testing system of the present invention uses a feedback control to adjust the frequency and amplitude of the testing signal, the sensing unit 130 has a testing threshold that is lower than the threshold of the conventional testing method, which usually is about 20 fF (1 fF=$10^{-15}$ Farad). The testing coverage thus can be advantageously raised.

Figure 2:
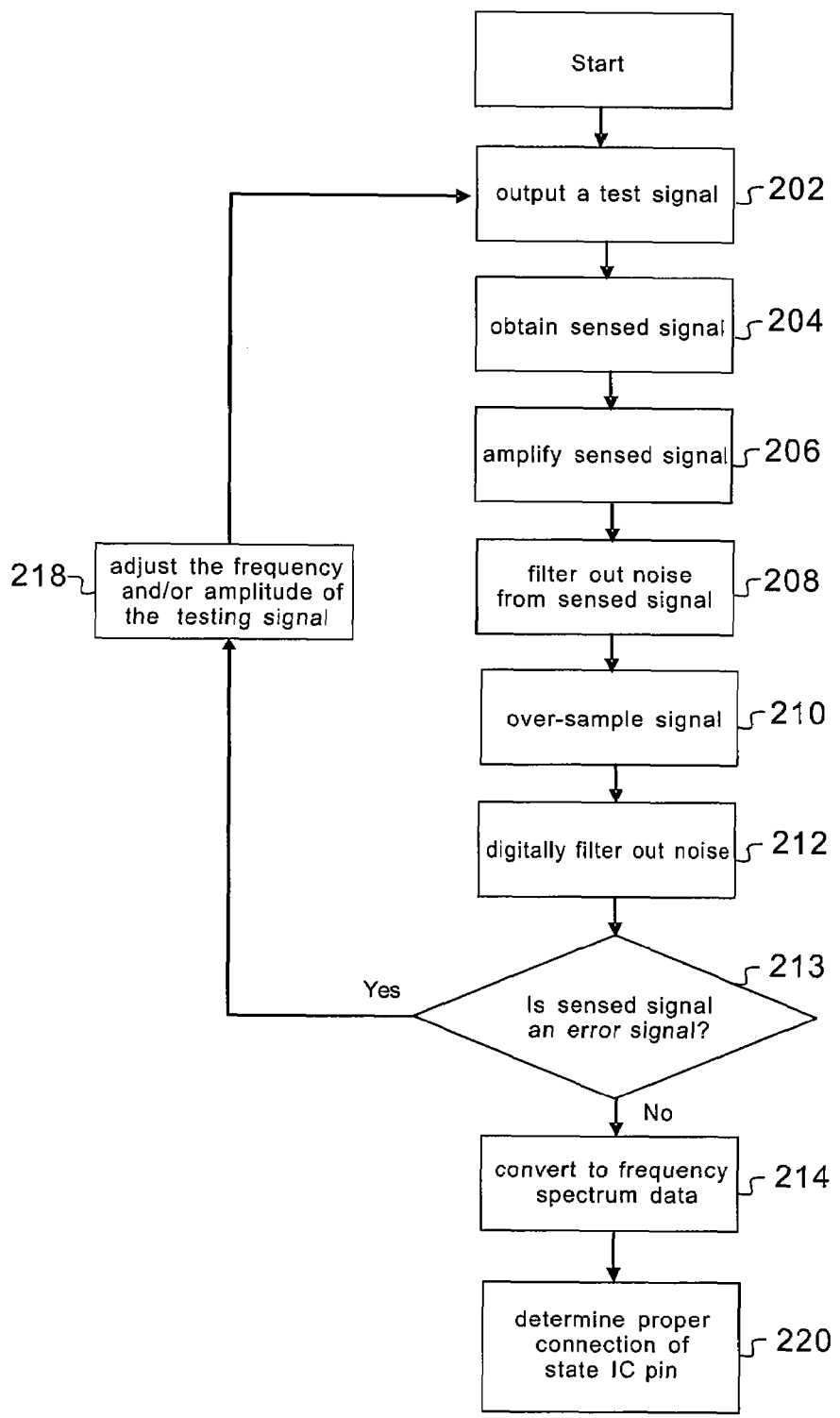
FIG. 2 is a flowchart of method steps for determining the connection state of a tested pin of an integrated circuit in an electronic device assembly according to one or more aspects of the invention.

Reference now is made to the flowchart of FIG. 2 in conjunction with FIG. 1 to describe process steps for testing a connection state between a selected pin of an integrated circuit and a printed circuit board according to one or more aspects of the invention. In initial step 202, a testing signal Si is outputted by the signal source 100 for testing a connection state between a selected pin 128 of integrated circuit 129 and printed circuit board 126. A resulting sensed analog signal is detected by sensing unit 130 in step 204, which initially may be a sensed signal St1' of a low frequency corresponding to a low frequency testing signal Si. The sensed low-frequency signal St1' is amplified through low-frequency signal amplifier 142b in step 206, and then filtered through filter 144b in step 208 to provide signal St3. The processed signal St3 is processed through an anti-alias filter and over-sampled in step 210, and then is digitally filtered in step 212 to form digital signal St6.

Before the determination of the connection state is made, a validation step 213 is performed to verify whether the sensed signal St1' from which the digital signal St6 derives is an error signal. For this purpose, digital signal St6 is used to derive an equivalent signal coupling value, which may correspond to a capacitance coupling value, for example. The computed signal coupling value then is compared against one predetermined signal coupling reference or range of reference values stored in computer 160. If the result of the comparison finds a correspondence with the associated reference value or falls within its predefined range, the spectrum analyzer 149 then converts digital signal St6 into frequency spectrum data in step 214. Subsequently, in step 220, computer 160 determines the connection state of the tested pin by comparing the converted values of the frequency spectrum data against a corresponding reference range. If the target data is within the predetermined reference range [v1, v2], as shown in FIG. 3a, then it is concluded that the tested pin is properly connected to the printed circuit board. In contrast, if the target data is below the range [v1, v2], the tested pin has a connection failure, as shown in FIG. 3b.

Referring again to FIG. 2, if the result of the comparison operation applied for the signal St6 in validation step 213 does not find a correspondence with the signal coupling reference, then the sensed signal is an error signal that does not correctly reflect the connection state of the tested pin. Accordingly, step 218 is performed to adjust the frequency and/or amplitude of the testing signal Si. The adjustment of the frequency of the testing signal Si may be achieved by raising it above about 100 kHz, and more specifically between 100 kHz and 500 kHz. Steps 202~213 then are repeated to acquire and process a new sensed signal for determining the connection state of the tested pin.

According to the present invention described herein, the testing system thus uses a feedback control to automatically adjust the frequency and amplitude of the source testing signal for different sensed capacitive coupling. As a higher signal-to-noise ratio is obtained, the testing coverage and testability of electronic components can be increased. In addition, by associating the use of noise filtering and over-sampling steps with the feedback control of the testing signal, the present invention can significantly raise the signal-to-noise ratio of the sensed signal to about 20 times of that obtained with conventional testing methods. As a result, the connection state of the tested pin can be determined with a higher precision as testing errors are substantially reduced. Another advantage of the testing system according to the present invention is that it can be economically implemented with existing component parts and testing probes without increasing the manufacture cost.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

What is claimed is:

1. A testing method for determining a connection state of an electronic component in an electronic device assembly, the method comprising:
   obtaining a sensed signal induced by capacitive coupling in response to the output of a testing signal passing through a tested pin of the electronic component;
   applying a signal processing sequence on the sensed signal, the processing sequence including:
      filtering and over-sampling the sensed signal to obtain a digital signal; and
      applying a validation test on the digital signal to determine whether the sensed signal is an acceptable measure, wherein the validation test is applied by computing the digital signal to determine a correspondence with a predetermined capacitive coupling reference;
   when a result of the validation test finds no correspondence with the predetermined capacitive coupling reference from the digital signal, raising a frequency and/or amplitude of the testing signal;
   when a correspondence with the predetermined capacitive coupling reference is found, converting the digital signal into frequency-domain spectrum data; and
   determining the connection state of the tested pin based on the frequency-domain spectrum data.

2. The method according to claim 1, wherein the signal processing sequence includes amplifying the sensed signal before filtering the sensed signal.

3. The method according to claim 1, wherein the signal processing sequence includes processing the sensed signal through an anti-alias filter before over-sampling the sensed signal.

4. The method according to claim 1, wherein the signal processing sequence includes processing the digital signal through a digital filter after over-sampling the sensed signal.

5. The method according to claim 4, wherein the digital filter includes a finite impulse response filter.

6. The method according to claim 1, further comprising:
   obtaining a new sensed signal corresponding to the testing signal of raised frequency and/or amplitude; and
   applying the signal processing sequence for the new sensed signal.

7. The method according to claim 1, wherein converting the digital signal into frequency-domain spectrum data includes applying a Fast Fourier Transform to convert the digital signal into a frequency-domain spectrum data, and determining the connection state of the tested pin includes comparing the frequency-domain spectrum data against a range of reference values.

8. A testing system suitable for determining a connection state of an electronic component in an electronic device assembly, the testing system comprising:
   a signal sensing unit providing a sensed signal induced by capacitive coupling in response to the output of a testing signal passing through a tested pin of the electronic component;
   a signal processor unit filtering and over-sampling the sensed signal to obtain a digital signal;
   an analyzer unit applying a processing sequence on the sensed signal, wherein the processing sequence comprises:
      determining whether the sensed signal is an acceptable measure by computing the digital signal to determine a correspondence with a predetermined capacitive coupling reference; and
      when a correspondence with the predetermined capacitive coupling reference is found, computing frequency-domain spectrum data from the digital signal for determining a connection state of the tested pin; and
   a controller raising a frequency and/or amplitude of the testing signal when no correspondence with the predetermined capacitive coupling reference is found from the digital signal.

9. The system according to claim 8, wherein the signal processor unit includes an anti-alias filter through which the sensed signal is processed before being over-sampled.

10. The system according to claim 8, wherein the signal processor unit includes a digital filter through which the digital signal is processed before being converted into frequency-domain spectrum data.

11. The system according to claim 10, wherein the digital filter includes a finite impulse response filter.

12. The system according to claim 8, wherein the analyzer unit applies a Fast Fourier Transform to convert the digital signal into frequency-domain spectrum data, and compares the frequency-domain spectrum data against a range of reference values for determining the connection state of the tested pin.

13. The system according to claim 8, wherein the testing signal has a frequency of about 100 kHz or higher.

* * * * *